(12) United States Patent
Tortorelli et al.

(10) Patent No.: US 9,705,080 B2
(45) Date of Patent: Jul. 11, 2017

(54) FORMING SELF-ALIGNED CONDUCTIVE LINES FOR RESISTIVE RANDOM ACCESS MEMORIES

(71) Applicant: MICRON TECHNOLOGY, INC., Boise, ID (US)

(72) Inventors: Innocenzo Tortorelli, Cernusco sul Naviglio (IT); Fabio Pellizzer, Boise, ID (US); Pietro Petruzza, Usmate Velate (IT)

(73) Assignee: Mircon Technology, Inc., Boise, ID (US)

( * ) Notice: Subject to any disclaimer, the term of this patent is extended or adjusted under 35 U.S.C. 154(b) by 0 days.

(21) Appl. No.: 15/182,202

(22) Filed: Jun. 14, 2016

(65) Prior Publication Data
US 2016/0293842 A1 Oct. 6, 2016

Related U.S. Application Data

(63) Continuation of application No. 14/876,540, filed on Oct. 6, 2015, now abandoned, which is a continuation of application No. 12/782,809, filed on May 19, 2010, now Pat. No. 9,196,530.

(51) Int. Cl.

| H01L 21/20 | (2006.01) |
|---|---|
| H01L 45/00 | (2006.01) |
| H01L 21/768 | (2006.01) |
| H01L 27/24 | (2006.01) |

(52) U.S. Cl.
CPC .... *H01L 45/1683* (2013.01); *H01L 21/76897* (2013.01); *H01L 27/2463* (2013.01); *H01L 45/04* (2013.01); *H01L 45/06* (2013.01); *H01L 45/065* (2013.01); *H01L 45/12* (2013.01); *H01L 45/126* (2013.01); *H01L 45/1233* (2013.01); *H01L 45/14* (2013.01); *H01L 45/144* (2013.01); *H01L 45/146* (2013.01); *H01L 45/147* (2013.01); *H01L 45/1675* (2013.01)

(58) Field of Classification Search
CPC ...................................................... H01L 28/55
See application file for complete search history.

(56) References Cited

U.S. PATENT DOCUMENTS

| 9,196,530 | B1 | 11/2015 | Tortorelli et al. | |
|---|---|---|---|---|
| 2003/0155609 | A1 | 8/2003 | Mandelman et al. | |
| 2003/0234449 | A1 | 12/2003 | Aratani et al. | |
| 2005/0151256 | A1* | 7/2005 | Natzle | H01L 23/5222 257/750 |
| 2007/0123018 | A1 | 5/2007 | Asano | |
| 2007/0187801 | A1 | 8/2007 | Asao et al. | |
| 2008/0151612 | A1 | 6/2008 | Pellizzer et al. | |
| 2009/0014706 | A1 | 1/2009 | Lung | |
| 2009/0016094 | A1* | 1/2009 | Rinerson | G11C 11/5685 365/148 |
| 2010/0006816 | A1 | 1/2010 | Magistretti et al. | |

(Continued)

*Primary Examiner* — Zandra Smith
*Assistant Examiner* — Andre' C Stevenson
(74) *Attorney, Agent, or Firm* — Dorsey & Whitney LLP

(57) ABSTRACT

Resistive random access memory elements, such as phase change memory elements, may be defined using a plurality of parallel conductive lines over a stack of layers, at least one of which includes a resistive switching material. The stack may be etched using the conductive lines as a mask. As a result, memory elements may be self-aligned to the conductive lines.

20 Claims, 3 Drawing Sheets

(56) References Cited

U.S. PATENT DOCUMENTS

| | | |
|---|---|---|
| 2010/0054030 A1 | 3/2010 | Lowrey |
| 2010/0133502 A1 | 6/2010 | Chen |
| 2010/0207095 A1 | 8/2010 | Lai et al. |
| 2010/0208517 A1 | 8/2010 | Lo et al. |
| 2010/0232200 A1 | 9/2010 | Shepard |
| 2011/0080766 A1 | 4/2011 | Chang et al. |
| 2016/0028002 A1 | 1/2016 | Tortorelli et al. |

* cited by examiner

FORMING SELF-ALIGNED CONDUCTIVE LINES FOR RESISTIVE RANDOM ACCESS MEMORIES

CROSS-REFERENCE TO RELATED APPLICATIONS

This application is a continuation application of pending U.S. application Ser. No. 14/876,540 filed Oct. 6, 2015, which is a continuation of U.S. application Ser. No. 12/782,809 filed May 19, 2010 and issued as U.S. Pat. No. 9,196,530 on Nov. 24, 2015. The aforementioned applications are incorporated by reference herein, in their entirety, for any purpose

BACKGROUND

This relates generally to resistive random access 5 memories (ReRAM).

ReRAM relies on materials that can be electrically switched between a higher conductive state and a lower conductive state several times. One type of ReRAM, a phase change memory, uses phase change materials, i.e., materials that may be electrically switched between a generally amorphous and a generally crystalline state. One type of phase change memory element utilizes a phase change material that may be, in one application, electrically switched between a structural state of generally amorphous and generally crystalline local order or between different detectable states of local order across the entire spectrum between completely amorphous and completely crystalline states.

A phase change memory element may be formed from a stack of layers including, for example, a chalcogenide layer, a heater, and electrode layers. During the etching of the individual memory elements from this stack, a relatively high aspect ratio structure results, made up of strips of materials defined by the stack. It is sometimes desirable to use a copper metal line for the bitline in order to reduce resistance, especially in relatively small feature sized technologies.

DETAILED DESCRIPTION

In accordance with some embodiments, a ReRAM memory array may be formed of individual memory elements coupled in a grid of address lines, which may be called rows and bitlines. Conventionally, ReRAM memory arrays include a memory element and a select device in series for each memory element. The select device may be a bipolar junction transistor, an MOS transistor, an ovonic threshold switch, or any other suitable switch.

Because of the number of layers that form the stack that is etched to form the individual memory elements, a relatively high aspect ratio structure results in some cases. On top of the stack may be copper bitlines that reduce the resistance of the resulting memory array.

The metal bitlines on the top of the stack may be patterned. Conventionally, this raises cost issues with respect to extra masks and alignment issues, especially at relatively reduced pitch levels. Moreover, the deposition of metal on top of the stack raises issues with respect to filling the dielectric material between adjacent bitlines in order to avoid copper extrusion and possible shorts.

In accordance with some embodiments, the entire array may be defined using only one mask to pattern a relatively small pitch metal bitline with reasonably low sheet resistance. In some embodiments, the bitlines are defined on top of the whole stack and then used as a mask to complete a self-aligned etch of the entire stack. This etch may use a standard blanket dry etch with relatively high bitline metal selectivity in some embodiments. As a result, the constraints on the filling dielectric may be relaxed because no metal line will be subsequently patterned on top of the final stack, in some embodiments.

Figure 1:
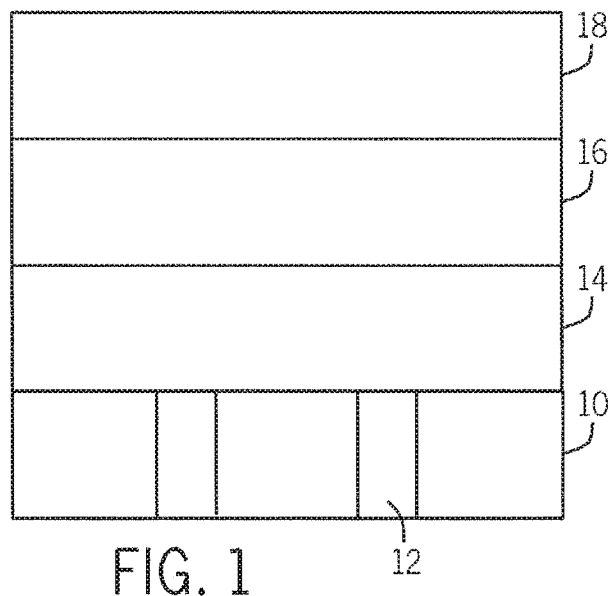
FIG. 1 is an enlarged, cross-sectional view of a stack of layers in the course of forming a ReRAM memory according to one embodiment.

Referring to FIG. 1, a stack to form an array of ReRAM memory elements may be formed on top of a semiconductor substrate (not shown). Select devices (not shown) may be formed in that substrate or inside the total stack (back end selectors). A plurality of bottom electrodes 10 may be defined. The electrodes 10 may be separated by a dielectric material 12. In some embodiments, the bottom electrodes may be tungsten and the dielectric material may be silicon dioxide, but other materials may also be used.

In an embodiment where the ReRAM memory is a phase change memory, a heater layer 14 may be made of any suitable material compatible with the other materials in the stack in order to provide Joule heating of the overlying chalcogenide layer 16. For example, titanium silicon nitride may be used in one embodiment. The Joule heating may be used to transition the chalcogenide between more and less conductive states. Particularly, the chalcogenide material may be associated with amorphous and crystalline phases, as well as, in some cases, a variety of intermediate phases. The heater layer 14 may be responsible for providing Joule heat for phase transition.

Finally, a cap 18 may be formed over the resistive switching material 16. The cap 18 may ultimately form the upper electrodes of the memory elements and may be formed of a suitable, compatible, conductive material. Suitable materials for the cap include titanium, titanium nitride or tungsten. The resistive switching material 16 may be, for example, a phase change material based on germanium, antimony, tellurium, called GST, for example. Examples of resistive switching material 16 for non-phase change ReRAM memories may include nickel oxide, copper, or silver charge transfer complexes, iron oxides, titanium dioxide, $SiO_2$, $SrZrO_3$, $PrO_7CaO_3$, or $MnO_x$.

The cross-section shown in FIG. 1 is in the X or row direction. Thus, the bitlines extend into the page in FIG. 1.

Figure 2:
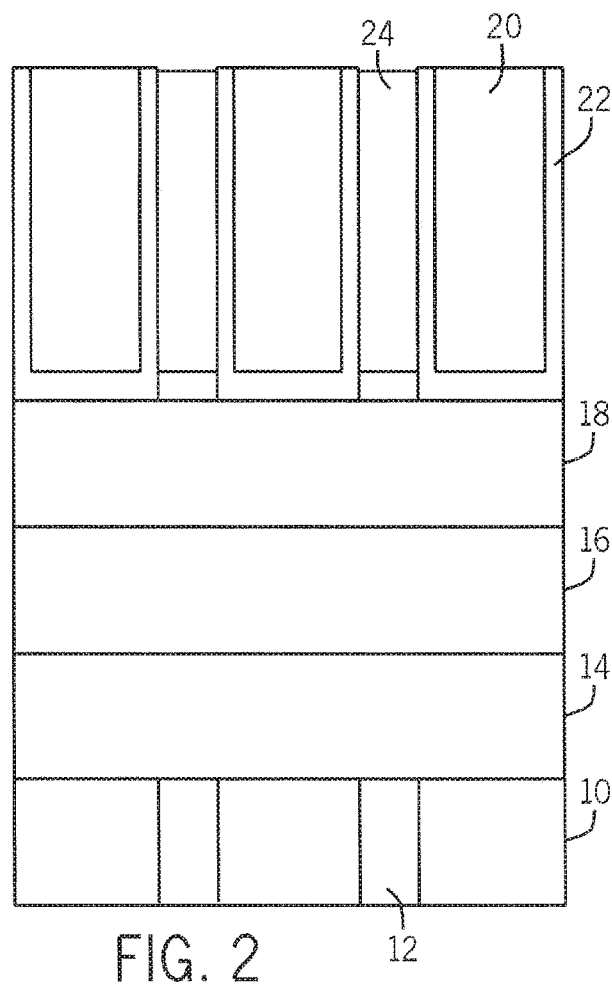
FIG. 2 is an enlarged, cross-sectional view of the stack shown in FIG. 1 after additional layers have been deposited and patterned.

In FIG. 2, the conductive lines 20 have already been deposited and extend as strips into the page in the bitline direction. The metal lines may be copper or copper alloy and may include a seed layer (not shown). The lines 20 may be metal and may be bitlines in some embodiments.

A barrier 22 surrounds each line 20 on three sides, in some embodiments. The barrier 22 chemically isolates the lines from the switching layer, reducing the copper diffusion into the active material in the embodiments where the lines 20 are formed of copper. The barrier 22 is conductive. Suitable materials for the barrier 22 include tantalum, tantalum containing compounds, titanium and titanium containing compounds.

A filling dielectric 24 separates one line 20 from its neighbors. The lines 20 may be formed using standard damascene processing. The dielectric 24 may be different from, or the same as, the dielectric material 12, in some embodiments.

Figure 3:
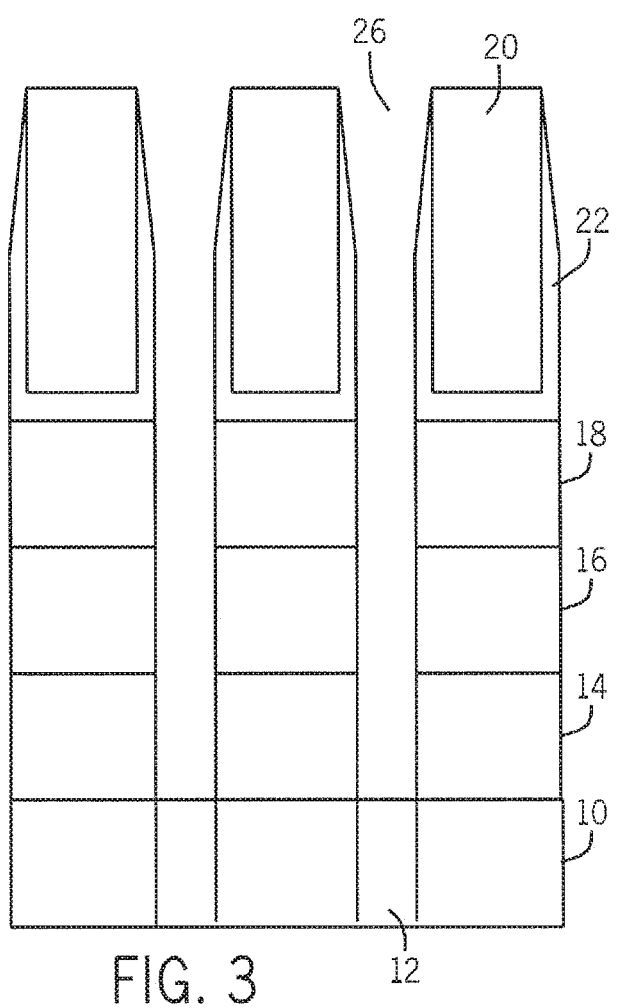
FIG. 3 is an enlarged, cross-sectional view of the embodiment shown in FIG. 2 after a blanket etch in accordance with one embodiment.

Next, the lines 20 are used as hard masks for a self-aligned blanket etch of the entire stack, as indicated in FIG. 3. In one embodiment, the blanket etch is a highly selective to the line material (such as copper). For example, a plasma etch using CF4 etchant may be used, but any etch able to etch active material and most common dielectrics, including oxide and nitride, may also be used. The etch may go all the way down and stop on the dielectric layer 12, forming spaced trenches 26. The trenches 26 may stop because of the nature of the dielectric material 12 in some embodiments. But, in other embodiments, a fixed time etch plus over-etch may be used.

As a result of the self-aligned etching, some of the barrier material 22 may be removed at the upper ends of the lines 20, as depicted in FIG. 3. In addition, some over-etching may occur down into the dielectric material 12 without adverse effect.

Thus, after defining the lines 20, only a single etch (and no additional masking) is needed to etch the entire stack because the metal lines act as hard masks in some embodiments. Thus, only one dedicated mask is needed, in some embodiments, and that mask is used to define the lines 20.

Figure 4:
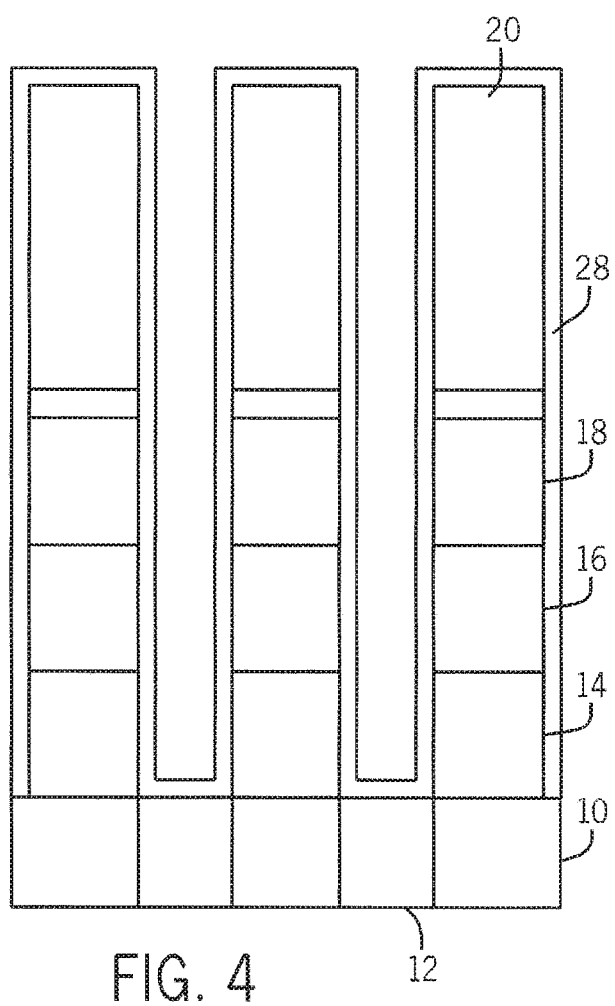
FIG. 4 is an enlarged, cross-sectional view of the embodiment shown in FIG. 3 after sealing.

Next, as shown in FIG. 4, the entire structure may be sealed with an appropriate sealing material 28 deposited over the etch structure shown in FIG. 3. The sealing material 28 need not totally fill the voids between adjacent lines 20. Even with a high aspect ratio stack (e.g. seven to one), the filling constraints are relaxed in some embodiments. The filling constraints are relaxed because if some voids are present between adjacent bitlines, no other metal would be patterned on top of the structure. Therefore, the risk of subsequent metal extrusions is reduced because of the absence of overlying metal. Conventionally, the sealing material may be oxide or nitride, but any other dielectric material may be used.

As a result, the memory elements are self-aligned to the overlying lines 20. As used herein, "self-aligned" means that edges of a memory element are either perfectly aligned with edges of a line 20 or edges of the memory element overlap or underlap edges of the line, but do so by substantially the same amount on opposing sides.

Programming to alter the state or phase of the material may be accomplished by applying voltage potentials to the bottom electrodes 10 and lines 20, thereby generating a voltage potential across a memory element including a resistive switching material 16. Considering the case of phase change memories, when the voltage potential is greater than the threshold voltages of any select device and memory element, then an electrical current may flow through the heater 14 and material 16 in response to the applied voltage potentials, and may result in heating of the material 16.

This heating may alter the memory state or phase of the material 16, in one phase change memory embodiment. Altering the phase or state of the material 16 may alter the electrical characteristic of memory material, e.g., the resistance or threshold voltage of the material may be altered by altering the phase of the memory material.

In the "reset" state, memory material may be in an amorphous or semi-amorphous state and in the "set" state, memory material may be in a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to melt and then quenched to vitrify and "reset" memory material in an amorphous state e.g., program memory material to a logic "0" value). Heating the volume of memory material to a relatively lower crystallization temperature may crystallize or devitrify memory material and "set" memory material (e.g., program memory material to a logic "1" value). Various resistances of memory material may be achieved to store information by varying the amount of current flow and duration through the volume of memory material References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising: forming a stack, wherein the stack includes a plurality of conductive lines separated by a dielectric material, each conductive line of the plurality of conductive lines comprising: a metal; and a barrier layer surrounding the metal on three sides; using said metal as a hard mask, removing at least a portion of said stack to form a plurality of memory cells separated by a plurality of trenches.

2. The method of claim 1, wherein forming the stack comprises:
   forming a chalcogenide layer between a heater layer and an electrode layer.

3. The method of claim 1, wherein the plurality of conductive lines are formed by a damascene process.

4. The method of claim 1, further comprising:
   forming a sealing layer over the plurality of memory cells, wherein the sealing layer is formed on sidewalls of each memory cell of the plurality of memory cells.

5. The method of claim 4, further comprising:
   removing at least a portion of the sealing layer from a top surface of each memory cell of the plurality of memory cells.

6. The method of claim 1, wherein the plurality of conductive lines are separated by a dielectric material.

7. The method of claim 1, wherein removing at least a portion of said stack comprises removing at least a portion of the barrier layer along sidewalls of the plurality of memory cells.

8. A method comprising:
   forming a stack, the stack comprising:

a plurality of bottom electrodes;
a heater layer;
a chalcogenide layer; and
a cap layer;
forming a dielectric layer over the cap layer;
forming a plurality of barrier layers and conductive lines in the dielectric layer, the barrier layer surrounding the metal on three sides; and
using the metal as a mask, etching the stack to form a plurality of spaced trenches defining a plurality of memory cells.

9. The method of claim 8, wherein etching the stack comprises performing a plasma etch using a CF4 etchant.

10. The method of claim 8, wherein etching the stack removes at least a portion of the barrier layer along sidewalls of the plurality of memory cells.

11. The method of claim 8, further comprising:
depositing a sealing material, wherein the sealing material covers at least a portion of sidewalls of the plurality of memory cells.

12. The method of claim 8, wherein the each conductive line of the plurality of conductive lines is aligned with a corresponding bottom electrode of the plurality of bottom electrodes.

13. The method of claim 8, wherein the bottom electrodes are separated by a second dielectric material.

14. The method of claim 13, wherein the spaced trenches extend through the stack to the second dielectric.

15. An method comprising:
forming a stack, the stack comprising:
a plurality of bottom electrodes separated by a dielectric material;
a layer of resistive switching material; and
an upper electrode layer;
forming a plurality of conductive lines over the upper electrode layer and aligned with the plurality of bottom electrodes; and
using the plurality of conductive lines as a hard mask, etching a plurality of trenches in the stack, wherein the plurality of trenches extend through the stack to the dielectric material to form a plurality of memory elements.

16. The method of claim 15, wherein the plurality of conductive lines are defined by a barrier layer.

17. The method of claim 16, wherein at least a portion of the barrier layer is removed by etching the plurality of trenches.

18. The method of claim 15, further comprising:
depositing a sealing material over the plurality of memory elements.

19. The method of claim 18, wherein the sealing material only fills a portion of each trench of the plurality of trenches.

20. The method of claim 15, wherein the plurality of trenches extend through the stack to at least the dielectric material.

* * * * *

UNITED STATES PATENT AND TRADEMARK OFFICE
CERTIFICATE OF CORRECTION

PATENT NO. : 9,705,080 B2  
APPLICATION NO. : 15/182202  
DATED : July 11, 2017  
INVENTOR(S) : Innocenzo Tortorelli, Fabio Pellizzer and Pietro Petruzza Page 1 of 1

It is certified that error appears in the above-identified patent and that said Letters Patent is hereby corrected as shown below:

On the Title Page

|  | Reads | Should Read |
|---|---|---|
| Item (73) Assignee | "Mircon Technology, Inc." | --Micron Technology, Inc.-- |

Signed and Sealed this  
Twenty-eighth Day of May, 2019

Andrei Iancu  
*Director of the United States Patent and Trademark Office*